United States Patent [19]

Kuesters et al.

[11] 4,134,813

[45] Jan. 16, 1979

[54] PHOTOPOLYMERIZABLE COMPOSITION AND ITS USE

[75] Inventors: Werner Kuesters; Rolf Osterloh, both of Ludwigshafen; Manfred Jacobi, Frankenthal, all of Fed. Rep. of Germany

[73] Assignee: BASF Aktiengesellschaft, Rheinland, Pfalz, Fed. Rep. of Germany

[21] Appl. No.: 858,744

[22] Filed: Dec. 8, 1977

[30] Foreign Application Priority Data

Dec. 24, 1976 [DE] Fed. Rep. of Germany ....... 2658935

[51] Int. Cl.$^2$ ............................ C08F 2/46; C08F 4/00; C08F 8/18

[52] U.S. Cl. ............................ 204/159.24; 96/115 P; 204/159.15; 204/159.16; 204/159.17; 204/159.18; 204/159.19; 260/837 R; 427/54; 428/418; 428/463

[58] Field of Search ............... 204/159.18, 159.24, 204/159.15; 96/115 P; 427/54

[56] References Cited

U.S. PATENT DOCUMENTS

| 3,759,807 | 9/1973 | Osborn et al. ............ 204/159.23 |
| 3,787,212 | 1/1974 | Heimsch .................... 204/159.24 X |
| 3,857,769 | 12/1974 | McGinniss ............... 204/159.24 |
| 3,903,322 | 9/1975 | Ravve et al. ............ 427/54 |
| 3,966,573 | 6/1976 | Bean ........................ 204/159.23 |

Primary Examiner—Richard B. Turer

Attorney, Agent, or Firm—Keil, Thompson & Shurtleff

[57] ABSTRACT

A photopolymerizable composition which contains one or more olefinically unsaturated compounds and from 0.2 to 20% by weight (based on the unsaturated compound(s)) of a photoinitiator, with or without conventional additives, the photoinitiator being a mixture of one or more aromatic carbonyl compounds of the general formula (A)

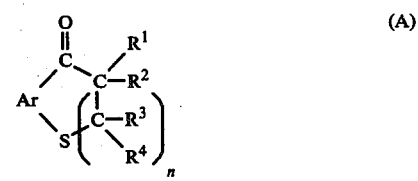

where Ar is an ortho-arylene radical which may or may not be substituted by one or more radicals $R^1$ to $R^4$, $R^1$, $R^2$, $R^3$ and $R^4$ are identical or different and each is H, alkyl or 1 to 5 carbon atoms, phenyl, halogen, alkoxy of 1 to 5 carbon atoms, alkaryl of 7 to 11 carbon atoms, aralkyl of 7 to 11 carbon atoms or $-CO_2R^9$, where $R^9$ is alkyl of 1 to 5 carbon atoms, and n is 0 or 1, and an amine, with or without an aromatic carbonyl compound which differs from (A).

This photopolymerizable composition is particularly suitable for the manufacture of photopolymer printing plates and UV-curing printing inks.

10 Claims, No Drawings

PHOTOPOLYMERIZABLE COMPOSITION AND ITS USE

The present invention relates to a photopolymerizable composition which contains photoinitiators, and to its use for the manufacture of coatings, UV-curing printing inks and photopolymer printing plates.

Mixtures of olefinically unsaturated compounds, conventional additives and photoinitiators, which can be polymerized by UV radiation, have been disclosed and are used for, for example, the production of coatings or of photopolymer printing plates. A large number of photoinitiators have been proposed in the patent literature and some have also already been employed in industry; these include azo, diazo and diazonium compounds, α-diketones and their derivatives, acyloins and their derivatives, aromatic disulfides and aromatic carbonyl compounds containing halogen or sulfur. However, the usefulness of the proposed photoinitiators is limited by a number of disadvantages. For example, most of the initiators are insufficiently reactive for many purposes, especially if the photopolymerization is to be carried out in the presence of atmospheric oxygen. Other initiators either are only extremely slightly soluble in the polymerizable compounds at room temperature, or cause distinct yellowing when the photopolymerizable composition is cured, this yellowing being very undesirable, for example for the production of coatings.

Unsatisfactory results are also obtained if the photopolymerizable compositions additionally contain pigments. It is assumed that most pigments absorb a substantial proportion of the radiation and that the residual radiation is insufficient to produce, from the photoinitiator, the amount of free radicals required for rapid UV curing.

It is true that a combination of chlorothioxanthone and methyldiethanolamine, as proposed in U.S. Pat. No. 3,759,807, or a combination of benzophenone and Michlers ketone, as proposed in German Laid-Open Application DOS 2,216,154, permits rapid UV curing of coating compositions which contain unsaturated photopolymerizable compounds, but the cured coatings exhibit distinct yellowing. Furthermore, chlorothioxanthone is only slightly soluble in the mixture to be polymerized, whilst with Michlers ketone relatively thick layers cannot be adequately cured all the way through. Again, it is true that photopolymerizable compositions which contain an aromatic carbonyl compound, e.g. diethoxyacetophenone (German Laid-Open Application DOS 2,261,383) or 2-phenylthioacetophenone U.S. Pat. No. 3,720,635) do not tend to yellow, but their reactivity is relatively low so that they are hardly suitable for applications where a high rate of curing is absolutely essential.

It is an object of the present invention to provide photopolymerizable compositions, containing photoinitiators, which are very reactive and which, on UV radiation, only yellow slightly, if at all. It is a further object of the invention to provide photoinitiators which permit UV curing even of pigmented photopolymerizable compositions, and which are readily accessible by simple methods of synthesis and are readily soluble at room temperature in the compounds to be polymerized.

We have found that these objects are achieved, according to the present invention, with a photopolymerizable composition which contains one or more olefinically unsaturated compounds and from 0.2 to 20 percent by weight (based on the unsaturated compound(s)) of a photoinitiator, with or without conventional additives, wherein the photoinitiator is a mixture comprising:

(A) one or more aromatic carbonyl compounds of the general formula (A)

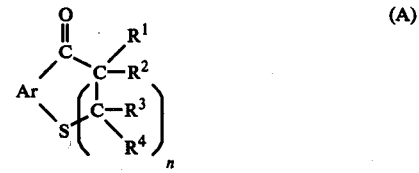

where Ar is an ortho-arylene radical, for example one which is substituted by one or more non-hydrogen radicals $R^1$ to $R^4$, $R^1$, $R^2$, $R^3$ and $R^4$ are identical or different and each is H, alkyl of 1 to 5 carbon atoms, phenyl, halogen, alkoxy of 1 to 5 carbon atoms, alkaryl of 7 to 11 carbon atoms, aralkyl of 7 to 11 carbon atoms or —$CO_2R^9$, $R^9$ being alkyl of 1 to 5 carbon atoms, and n is 0 or 1, and (B) an amine.

In a preferred embodiment of the invention, the photopolymerizable composition contains, as photoinitiator, a mixture of (A) an aromatic carbonyl of the general formula (A) defined above,
(B) an amine and
(C) an aromatic carbonyl compound of the general formula (C)

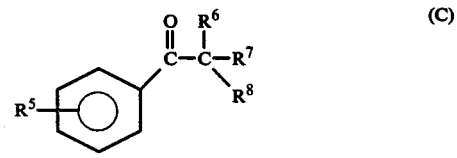

where $R^5$ has the same meaning as $R^1$ in the general formula (A), and $R^6$ is H, Cl or $R^5$-phenyl, with the proviso that, if $R^6$ is H or Cl, $R^7$ and $R^8$ are identical or different and each is H, Cl, alkyl of 1 to 5 carbon atoms, $R^5$-phenyl or alkoxy of 1 to 5 carbon atoms, and that, if $R^6$ is $R^5$-phenyl, $R^7$ is alkoxy of 1 to 7 carbon atoms or tetrahydropyranyl and $R^8$ is alkoxy of 1 to 7 carbon atoms, H, alkyl of 1 to 5 carbon atoms or $CH_2OH$, or $R^7$ and $R^8$ together are a O—$C_nH_{2n}$—O bridge, n being an integer from 2 to 8.

Further, preferred embodiments of the present invention are photopolymerizable compositions which contain, as olefinically unsaturated compounds, one or more monomeric acrylic, methacrylic or vinyl compounds and/or unsaturated polyesters, epoxide-acrylates, unsaturated aminoplast resins, polyester-acrylates, polyetheracrylates or urethane-acrylates and, as aromatic carbonyl compounds (A), thiochromanone, 6-methyl-thiochromanone, 3,6-dimethyl-thiochromanone, 3,3,6-trimethylthiochromanone or 5,6-benzothiochromanone.

The present invention provides, in a special embodiment, photopolymerizable compositions of the above type which contain up to about 50 percent by weight, based on the total composition, of an organic or inorganic pigment or dye.

The invention also relates to the use of the photopolymerizable compositions according to the invention for the production of coatings, photopolymer printing plates and UV-curing printing inks.

Suitable olefinically unsaturated compounds are all photopolymerizable organic compounds which contain at least one carbon-carbon double bond; they include both low molecular weight and high molecular weight compounds. Of course, mixtures of different unsaturated compounds can also be photopolymerized; to control the viscosity of the photopolymerizable composition, it is advantageous to mix a relatively viscous high molecular weight unsaturated compound with one or more low molecular weight compounds. Examples of suitable low molecular weight photopolymerizable compounds are acrylic compounds, e.g. acrylic acid or methacrylic acid, esters thereof with alkanols of 1 to 20 carbon atoms, monoesters, diesters, triesters or tetraesters with dialkanols, trialkanols or tetraalkanols of up to 20 carbon atoms, nitriles, amides, N-methylolamides and ethers of the N-methylolamides with monoalkanols of 1 to 4 carbon atoms, and vinyl compounds, e.g. vinyl esters, vinyl ketones, vinyl ethers, N-vinylpyrrolidone or N,N'-divinylureas.

Suitable polymerizable relatively high molecular weight compounds are:

Unsaturated polyesters having a molecular weight of from 500 to 5,000, which have been prepared from α,β-unsaturated dicarboxylic acids, e.g. maleic acid, fumaric acid or itaconic acid, which may or may not be partially replaced by saturated dicarboxylic acids, e.g. adipic acid, phthalic acid or terephthalic acid, and alkanediols, e.g. ethylene glycol, propylene glycol, butanediol, neopentylglycol or oxyalkylated bisphenol A, with or without polyhydric alcohols or polybasic carboxylic acids;

Epoxide-acrylates having a molecular weight of from 200 to 1,500, which have been prepared by reacting acrylic acid or methacrylic acid with aromatic or aliphatic glycidyl ethers e.g. based on bisphenol A, butanediol, pentaerythritol or neopentylglycol, or with epoxidized polybutadienes or linseed oils;

urethane-acrylates having a molecular weight of from 200 to 4,000, prepared by reacting hydroxyalkyl acrylates, e.g. hydroxyethyl acrylate or methacrylate, hydroxypropyl acrylate or methacrylate or butanediol monoacrylate or monomethacrylate, with polyisocyanates, preferably with aliphatic or cycloaliphatic diisocyanates, e.g. hexamethylene diisocyanate or isophorone diisocyanate, with or without polyols, e.g. polyacrylates or polyesters containing hydroxyl groups;

polyester-acrylates, prepared by reacting saturated polyesters, containing hydroxyl groups, with acrylic acid or methacrylic acid;

polyether-acrylates, i.e. reaction products of polyether-polyols of molecular weight from 400 to 2,000 with acrylic acid or methacrylic acid;

unsaturated aminoplast resins, prepared by reacting aminoplasts, e.g. melamine/formaldehyde or urea/formaldehyde condensation products, which may or may not be etherified, with hydroxyalkyl acrylates; and butadiene polymers, vinyl-urethanes and diallyl phthalate prepolymers.

Mixtures of unsaturated polyesters, epoxide-acrylates or urethane-acrylates and low molecular weight acrylic esters are particularly preferred.

The aromatic carbonyl compounds A can as a rule be synthesized very simple by methods disclosed in the literature. For example, methods of synthesis are described by F. Arndt in Chem. Ber., 56, 1269 (1923); by R. H. Martin et al. in Tetrahedron, 21, 1833 (1965), and in "Grundlegende Operationen der Farbenchemie," 5th Edition (Vienna 1943), page 313, and by D. S. Tarbell et al. in J. Am. Chem. Soc., 75, 1985 (1953).

Examples of suitable carbonyl compounds (A) are thiochromanone, 6-methyl-thiochromanone, 6-methyl-thioflavanone, 3,6-dimethyl-thiochromanone, 3,6-dimethyl-thioflavanone, 3,3,6-trimethyl-thiochromanone, 3,3,6-trimethyl-thioflavanone, 5,6-benzo-thiochromanone, 5,6-benzo-thioflavanone, 6-chloro-thiochromanone, 2-bromo-thiochromanone, benzo(b)thiophen-3-one and 2,2-dimethyl-benzo(b)thiophen-3-one.

(B) Preferred amines are those of the general formula (B)

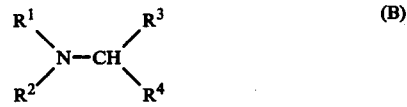

where $R^1$, $R^2$, $R^3$ and $R^4$ are identical or different and are each hydrogen or any organic radical, any two radicals being optionally linked toegther to form, with the linking atom, a ring. The amines may be primary, secondary or tertiary, aliphatic, aromatic or heterocyclic. However, it is important that at least one carbon atom directly adjacent to the nitrogen should carry at least one hydrogen.

Suitable amines are described, for example, in U.S. Pat. No. 3,759,807 or German Laid-Open Application DOS 2,458,345. Tertiary amines are preferred, examples being N-ethylmorpholine, triethylamine, triethanolamine, methyldiethanolamine, dimethylethanolamine, methyldiisopropanolamine, dimethylisopropanolamine, triisopropanolamine, p-dimethylaminobenzaldehyde, methyl p-dimethylaminobenzoate, dimethyl 4-dimethylamino-phthalate, Michlers ketone, 1,2-dimorpholinyl-ethane, N,N,N',N'-tetramethylethylenediamine, diethylaminoethyl acrylate and morpholino-N-ethyl acrylate.

The photoinitiator components (A) + (B) to be used according to the invention can be employed with or without carbonyl compounds (C); however, they exhibit the highest reactivity when used with carbonyl compounds (C). In this connection, it is particularly surprising that the carbonyl compounds (C) make a greater contribution to the activity of the photoinitiators according to the invention than would have been expected from their own activity.

Examples of suitable carbonyl compounds (C) are compounds of the benzoin or benzil type, as described in detail in German Laid-Open Applications DOS 2,235,365, 2,261,383, 2,337,813, 2,232,497 and 1,769,854, German Published Application DAS 1,694,149 and U.S. Pat. No. 2,448,828. α-Halo-ketones, as described, for example, in German Laid-Open Application DOS 2,342,817 may also be used.

Examples of particularly preferred compounds (C) are benzil-dimethylketal, benzil-diethylketal, benzilethyleneketal, benzil-neopentyleneketal, benzoin methyl ether, α-methylolbenzoin methyl ether, benzoin isopropyl ether, benzoin tetrahydropyranyl ether, ω,ω-diethoxyacetophenone and ω,ω,ω-trichloroacetophenone.

According to the invention, the photopolymerizable composition contains from 0.2 to 20, preferably from 0.5 to 10, percent by weight (based on the unsaturated compound(s)) of photoinitiator.

The three components of the photoinitiator are in general present in amounts of from about 0.1 to 10%, preferably from 0.1 to 5%, of the aromatic carbonyl compound (A), from 0.1 to 15%, preferably from 0.2 to 10% of amine (B) and from 0 to 10%, preferably from 0 to 5%, of the aromatic carbonyl compound (C), component (B) being employed in an amount which is at least 25% of the sum of components (A) + (C), but preferably from about one to five times the said sum, and the percentages again being based on the unsaturated compound(s).

The required proportion of one or more components of the photoinitiators according to the invention can also be added to the binder together with an additional polymerizable monomer, oligomer or polymer, or as a mixture with conventional additives or inert polymers.

In addition to the polymerizable compounds and the photoinitiators, the photopolymerizable compositions may also contain the conventional amounts of conventional additives, e.g. inorganic or organic pigments or dyes, inorganic or organic fillers, polymerization inhibitors, e.g. hydroquinone or tert.-butylhydroquinone, anti-skinning compounds, e.g. paraffin, flow control agents, e.g. silicone oil, matting agents or lubricants, e.g. waxes, and organic solvents, e.g. alcohols, hydrocarbons and ketones.

It is a distinct advantage of the invention that a plurality of useful pigments may be employed in amounts of up to about 50 percent by weight of the total composition. For example, opacifying pigments, e.g. zinc oxide, may be used. Titanium dioxide, e.g. anatase and especially rutile can also be readily employed, though it is as a rule far more difficult to cure conventional photopolymerizable compositions with UV radiation in the presence of rutile than in the absence of rutile.

The photopolymerization is generally initiated with light having a wavelength of from 2,300 to 4,500 Å, and especially light with emission maxima at from 3,000 to 4,200 Å. Suitable radiation sources are mercury vapor lamps or superactinic fluorescent tubes.

The compositions according to the invention may be used for the production of coatings, especially coatings which are from 8 to 200 μm thick, on any desired substrates, e.g. metal, wood, plastic, paper or board. The coatings may be used for protective or decorative purposes, and in the latter case the reduced tendency to yellow, as compared with other photopolymerizable compositions, is advantageous.

The compositions can also be used for the preparation of UV-curing printing inks and print pastes for printing sheet metal, paper or plastics films, the thickness of the layers applied being from 0.5 to 8 μm. Finally, the compositions can also be used for the manufacture of photopolymerizable layers for the fixation of information and especially for the manufacture of photopolymer printing plates or photoresists.

In the Examples, parts and percentages are by weight.

EXAMPLE 1

A clear coating composition was prepared from a mixture of ethylenically unsaturated esters and ethers. This mixture consisted of 56.5 parts of a reaction product of 1 mole of bisphenol-A diglycidyl ether with 2 moles of acrylic acid, with 30.4 parts of butanediol diacrylate and 13.1 parts of 3-methylpentane-1,5-diol divinyl ether.

3 parts of methylthiochromanone and 3 parts of methyldiethanolamine were added as the photoinitiator to this solution.

50 μm thick layers of the clear finishes were knife-coated onto degreased glass plates and irradiated with a high pressure mercury lamp having an output of 80 W/cm of arc length. The distance between the lamp and the applied layer was 10 cm in each case. The irradiation time was varied by means of a conveyor belt capable of infinite speed variation on which the coated glass plates were passed under the UV lamp. In order to characterize the curing process, the conveyor belt speed (in m/min) which was just slow enough to give scratch-resistant coatings was determined. The word "scratch-resistant" means that the surface cannot be damaged by vigorous rubbing with a finger nail.

In the Example chosen, a scratch-resistant coating was obtained at belt speeds of up to 72 m/min.

EXAMPLE 2

The reaction product of 1 mole of bisphenol A diglycidyl ether with 2 moles of acrylic acid was dissolved in butanediol diacrylate to give a 65% strength solution. 3 parts of the substances listed in Table 1 and 3 parts of methyldiethanolamine were added to this solution. The test was carried out as described in Example 1.

| | Scratch-resistant up to a maximum conveyor belt speed of |
|---|---|
| 1) thiochromanone | 53 m/min |
| 2) 3-bromothiochromanone | 5 m/min |
| 3) 3,3-dibromothiochromanone | 5 m/min |
| 4) 6-methylthiochromanone | 72 m/min |
| 5) 6-methyl-3-bromothiochromanone | 5 m/min |
| 6) 6-methyl-3,3-dibromothiochromanone | 5 m/min |
| 7) 6-methylthioflavanone | 38 m/min |
| 8) 3,3-dibromo-6-methylthioflavanone | 5 m/min |
| 9) 3,6-dimethyl-thiochromanone | 72 m/min |
| 10) 3,3,6-trimethylthiochromanone | 100 m/min |
| 11) 5,6-benzo-thiochromanone | 24 m/min |

EXAMPLE 3

A 50 μm thick layer of a pigmented finish composed of 65 parts of an epoxide-acrylate (a reaction product of 1 mole of bisphenol A diglycidyl ether and 2 moles of acrylic acid), 35 parts of butanediol diacrylate, 65 parts of titanium dioxide pigment (rutile), 3 parts of 6-methylthiochromanone and 3 parts of methyldiethanolamine was knife-coated onto a zinc-phosphatized steel sheet and was cured with the lamp described in Example 1. A fully cured coating was obtained at a belt speed of 3 m/min. The coating was detached from the metal base and extracted with ethyl acetate (5 hours at the boil) to remove unpolymerized constituents. A butanediol diacrylate content of 1% was found by gas chromatography. In a comparative test in which the initiator consisted of 3 parts of benzil-dimethylketal and 3 parts of methyldiethanolamine, the extractable content of butanediol diacrylate after the same exposure time was > 15%, and furthermore this film was not scratch-resistant.

EXAMPLE 4

It was found that the action of the photoinitiator described in Example 1 could be greatly boosted by using combinations with conventional photoinitiators (e.g. benzil-dimethylketal). A clear finish as described in Example 1 was used, the initiators employed being:

(a) 2% of benzil-dimethylketal, 0.5% of 6-methylthiochromanone and 3.0% of methyldiethanolamine, based on olefinically unsaturated compounds, (b) 2% of benzil-dimethylketal, 1% of 6-methylthiochromanone and 3% of methyldiethanolamine, based on olefinically unsaturated compounds.

Scratch-resistant coatings were obtained with a) at a conveyor belt speed of up to 100 m/min and with b) at up to 125 m/min.

The following initiators were used for comparison, percentages in each case being based on olefinically unsaturated compounds.

(c) 0.5% of 6-methylthiochromanone and 3.0% of methyldiethanolamine.

(d) 1.0% of 6-methylthiochromanone and 3.0% of methyldiethanolamine.

(e) 2% of benzil-dimethylketal.

Scratch-resistant coatings were obtained at conveyor belt speeds of up to 38 m/min for c), up to 53 m/min for d) and up to 5 m/min for e).

We claim:

1. A photopolymerizable composition which contains at least one olefinically unsaturated compound and from 0.2 to 20 percent by weight (based on the unsaturated compound) of a photoinitiator, with or without conventional additives, wherein the photoinitiator is a mixture of (A) at least one aromatic carbonyl compound of the general formula (A)

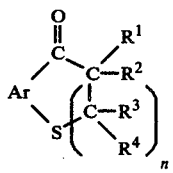

(A)

where Ar is an ortho-arylene radical which may or may not be substituted by one or more radicals $R^1$ to $R^4$, $R^1$, $R^2$, $R^3$ and $R^4$ are identical or different and each is H, alkyl of 1 to 5 carbon atoms, phenyl, halogen, alkoxy of 1 to 5 carbon atoms, alkaryl of 7 to 11 carbon atoms, aralkyl of 7 to 11 carbon atoms or $-CO_2R^9$, $R^9$ being alkyl of 1 to 5 carbon atoms, and n is 0 or 1, and (B) an amine.

2. A photopolymerizable composition as claimed in claim 1, wherein the photoinitiator is a mixture of (A) an aromatic carbonyl compound of the general formula (A) as defined in claim 1, (B) an amine and (C) an aromatic carbonyl compound of the general formula (C)

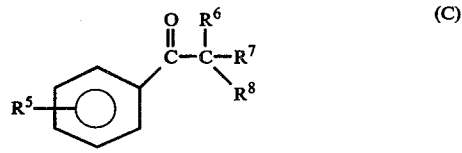

where $R^5$ has the same meaning as $R^1$ in the general formula (A), and $R^6$ is H, Cl or $R^5$-phenyl, with the proviso that, if $R^6$ is H or Cl, $R^7$ and $R^8$ are identical or different and each is H, Cl, alkyl of 1 to 5 carbon atoms, $R^5$-phenyl or alkoxy of 1 to 5 carbon atoms, and that, if $R^6$ is $R^5$-phenyl, $R^7$ is alkoxy of 1 to 7 carbon atoms or tetrahydropyranyl and $R^8$ is alkoxy of 1 to 7 carbon atoms, H, alkyl of 1 to 5 carbon atoms or $CH_2OH$, or $R^7$ and $R^8$ together are a $O-C_nH_{2n}-O$ bridge, n being an integer from 2 to 8.

3. A photopolymerizable composition as claimed in claim 1, wherein at least one monomeric compound selected from the group consisting of acrylic compounds, methacrylic compounds and vinyl compounds is used as the olefinically unsaturated compound.

4. A photopolymerizable composition as claimed in claim 1, wherein at least one compound selected from the group consisting of unsaturated polyesters, epoxide-acrylates, unsaturated aminoplast resins, polyester-acrylates, polyether-acrylates and urethane-acrylates is used as the olefinically unsaturated compound.

5. A photopolymerizable composition as claimed in claim 1, wherein the olefinically unsaturated compound is a mixture of the monomeric compound(s) as specified in claim 3 and the compound(s) as specified in claim 4.

6. A photopolymerizable composition as claimed in claim 1, wherein the amine (B) employed has the general formula

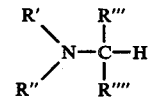

where R', R'', R''' and R'''' may be any organic radicals.

7. A photopolymerizable composition as claimed in claim 1, which contains up to about 50 percent by weight, based on total composition, of organic or inorganic pigments or dyes.

8. A process for the production of coatings using a photopolymerizable composition as claimed in claim 1.

9. A process for the manufacture of photopolymer printing plates using a photopolymerizable composition as claimed in claim 1.

10. A process for the manufacture of UV-curing printing inks using a photopolymerizable composition as claimed in claim 1.

* * * * *